(12) United States Patent
Rouh et al.

(10) Patent No.: US 8,481,431 B2
(45) Date of Patent: Jul. 9, 2013

(54) METHOD FOR OPENING ONE-SIDE CONTACT REGION OF VERTICAL TRANSISTOR AND METHOD FOR FABRICATING ONE-SIDE JUNCTION REGION USING THE SAME

(75) Inventors: Kyong Bong Rouh, Icheon-si (KR); Yong Seok Eun, Seongnam-si (KR); Eun Shil Park, Guri-si (KR)

(73) Assignee: SK Hynix Inc., Gyeonggi-do (KR)

( * ) Notice: Subject to any disclaimer, the term of this patent is extended or adjusted under 35 U.S.C. 154(b) by 207 days.

(21) Appl. No.: 13/161,846

(22) Filed: Jun. 16, 2011

(65) Prior Publication Data
US 2012/0208364 A1 Aug. 16, 2012

(30) Foreign Application Priority Data
Feb. 15, 2011 (KR) ........................ 10-2011-0013456

(51) Int. Cl.
*H01L 21/302* (2006.01)
*H01L 21/461* (2006.01)

(52) U.S. Cl.
USPC ........... 438/736; 438/156; 438/262; 438/268; 438/424; 438/427; 438/435; 438/666; 438/674; 438/696; 438/700; 438/702; 438/703; 438/704; 438/735; 438/761

(58) Field of Classification Search
USPC ................. 438/156, 262, 268, 424, 427, 435, 438/666, 674, 696, 700, 702–704, 735–736, 438/761
See application file for complete search history.

(56) References Cited

U.S. PATENT DOCUMENTS

| | | | | |
|---|---|---|---|---|
| 2012/0007258 A1* | 1/2012 | Oh et al. | ........................ | 257/776 |
| 2012/0009760 A1* | 1/2012 | Kim | ........................ | 438/430 |
| 2012/0009787 A1* | 1/2012 | Kim | ........................ | 438/674 |
| 2012/0064704 A1* | 3/2012 | Kim | ........................ | 438/513 |
| 2012/0156868 A1* | 6/2012 | Kim et al. | ........................ | 438/589 |

FOREIGN PATENT DOCUMENTS

| | | |
|---|---|---|
| KR | 1020090093399 A | 9/2009 |
| KR | 1020100071406 A | 6/2010 |
| KR | 1020110003215 A | 1/2011 |

* cited by examiner

*Primary Examiner* — Bac Au
(74) *Attorney, Agent, or Firm* — William Park & Associates Patent Ltd.

(57) ABSTRACT

A method for opening a one-side contact region of a vertical transistor is provided. The one-side contact region of the vertical transistor is opened using a polysilicon layer, a certain portion of which can be selectively removed by a selective ion implantation process. In order to selectively remove the polysilicon layer formed on one of both sides of an active region, at which the one-side contact is to be formed, impurity ion implantation is performed in a direction vertical to the polysilicon layer by a plasma doping process, and a tilt ion implantation using an existing ion implantation process is performed. In this manner, the polysilicon layer is selectively doped, and the undoped portion of the polysilicon layer is selectively removed.

21 Claims, 8 Drawing Sheets

METHOD FOR OPENING ONE-SIDE CONTACT REGION OF VERTICAL TRANSISTOR AND METHOD FOR FABRICATING ONE-SIDE JUNCTION REGION USING THE SAME

CROSS-REFERENCES TO RELATED APPLICATIONS

The present application claims priority under 35 U.S.C. 119(a) to Korean Application No. 10-2011-0013456, filed on Feb. 15, 2011, in the Korean intellectual property Office, which is incorporated herein by reference in its entirety set forth in full.

BACKGROUND

Exemplary embodiments of the present invention relate to a method for fabricating a semiconductor device, and more particularly, to a method for opening a one-side contact region of a vertical transistor and a method for fabricating a one-side junction region using the same.

As mobile devices are widely spread and digital home appliances become smaller in size, the degree of integration of semiconductor memory devices constituting the mobile devices or the digital home appliances is rapidly increasing. Particularly, in the case of a DRAM device or a flash memory device, various attempts are being made to store a larger quantity of information in a limited space. In general, a DRAM device is configured with a transistor and a capacitor and has a stack structure in which the transistor is formed on a silicon semiconductor substrate and the capacitor is formed on the transistor.

For electrical connection between the transistor and the capacitor, a storage node contact is formed between a source region of the transistor and a lower electrode of the capacitor. In addition, a drain region of the transistor is electrically connected to a bit line through a bit line contact. In the structure in which the capacitor is formed on the planar type transistor, films for signal transmission (for example, a word line and a bit line) are formed between the transistor and the capacitor. Hence, it is difficult to ensure a space for increasing the capacity of the capacitor due to the space occupied by the films. Moreover, as a gate width of the planar type transistor becomes narrow to less than 40 nm, a larger amount of power may be consumed and an amount of a body current, which is a leakage current between the source region and the drain region of the transistor, may abruptly increase. In this regard, research into a vertical transistor is being actively conducted.

FIG. 1 is a view explaining the basic concept of a vertical transistor. As illustrated in FIG. 1, the vertical transistor 100 has a structure in which a drain region 112 is formed at one side of the lower portion of a semiconductor substrate 110, and a source region 114 is formed at one side of the upper portion of the semiconductor substrate 110. A channel region 116 is formed between the drain region 112 and the source region 114 in a vertical direction, and a gate dielectric film 118 and a gate electrode 120 are sequentially formed on the channel region 116, that is, the lateral side of the semiconductor substrate 110. When the vertical transistor 100 is applied to a DRAM device, a bit line is coupled to the drain region 112 and a storage node is coupled to the source region 114. Since the bit line is formed to be buried in the side of the lower portion of the semiconductor substrate 110, the space in which the storage node is to be formed is not reduced. Thus, the reduction of data storage capacity may be suppressed in spite of high integration. In addition, as the bit line is formed in a buried shape, bit line parasitic capacitance is reduced and thus the height of the storage node can be reduced by about ½ to ⅓.

However, in order to form the vertical transistor as described above, the drain region 112 may be formed at the one side of the lower portion of the semiconductor substrate 110. To this end, one side of the lower portion of the semiconductor substrate 110 at which the drain region 112 is to be formed, that is, the one-side contact region is opened. Although various methods for opening the one-side contact region and the method for fabricating the one-side junction region using the same have been proposed, they are composed of complicated steps and, in particular, much time is taken to perform the overall processes.

SUMMARY

An embodiment of the present invention is directed to a method for opening a one-side contact region of a vertical transistor, which can shorten time necessary to perform the overall processes, and a method for fabricating a one-side junction region using the same.

In an exemplary embodiment, a method for opening a one-side contact region of a vertical transistor includes: forming a first liner layer on both sides of each active region of a substrate which has active regions spaced apart by a trench; forming a second liner layer over a portion of the surface of the first liner layer; filling a lower portion of the trench with a first sacrificial layer so that a portion of the first liner layer is exposed; forming a third liner layer over the exposed portion of the first liner layer and the second liner layer; filling the inside of the trench defined by the third liner layer with a second sacrificial layer; forming a polysilicon layer on a resulting structure in which the second sacrificial layer is formed; selectively doping impurities into the polysilicon layer by performing a plasma doping process and a tilt ion implantation process on the polysilicon layer; selectively exposing the third liner layer disposed on one of the both sides of the active region, at which a one-side contact is to be formed, by selectively removing an undoped portion of the polysilicon layer; exposing the first liner layer disposed on the side, at which the one-side contact is to be formed, by removing the exposed portion of the third liner layer; and exposing a surface of a contact region, in which the one-side contact is to be formed, by removing the exposed portion of the first liner layer.

The polysilicon layer may be formed to have a thickness ranging from about 30 Å to about 100 Å. Specifically, the polysilicon layer may be formed to have a thickness ranging from about 60 Å to about 80 Å.

The impurities may be selectively doped into the polysilicon layer by sequentially performing the plasma doping process and the tilt ion implantation process.

The plasma doping process on the polysilicon layer may be performed using an impurity source including at least one of boron, arsenic, and phosphorus.

The plasma doping process on the polysilicon layer may be performed on a condition that applies bias under the substrate so that impurity ions have straightness in a direction vertical to the surface of the substrate.

The plasma doping process on the polysilicon layer may be performed with energy ranging from about 0.1 KeV to about 3 KeV.

The plasma doping process on the polysilicon layer may be performed at a dose ranging from about 1E14 ions/cm$^3$ to 3E15 ions/cm$^3$.

The plasma doping process on the polysilicon layer may be performed on a condition that a width of a pulse for the plasma doping is at least 2 seconds or more.

The tilt ion implantation process on the polysilicon layer may be performed at an angle at which impurity ions are selectively doped into one of the both sides of the polysilicon layer.

The angle at which the tilt ion implantation process may be performed on the polysilicon layer is set to about 15 degrees to about 30 degrees.

The tilt ion implantation process on the polysilicon layer may be performed using an impurity source including at least one of boron, arsenic, and phosphorus.

The tilt ion implantation process on the polysilicon layer may be performed with energy ranging from about 2.5 KeV to about 5 KeV.

The tilt ion implantation process on the polysilicon layer may be performed at a dose ranging from about $1E15$ ions/cm$^3$ to $4E15$ ions/cm$^3$.

The undoped portion of the polysilicon layer may be selectively removed by a wet etching process using an etching solution which selectively removes only an undoped portion.

The third liner layer may be formed using a material having a sufficient etching selectivity to the second liner layer so that the second line layer is not removed when the third liner layer is removed.

The second liner layer and the first sacrificial layer may be formed using a material having a sufficient etching selectivity to the first liner layer so that the second liner layer and the first sacrificial layer are not removed when the exposed portion of the first liner layer is removed.

The first liner layer may include a silicon oxide layer, the second liner layer may include a silicon nitride layer, the third liner layer may include a titanium nitride layer, and the first sacrificial layer may include a polysilicon layer.

In another embodiment, a method for fabricating a one-side junction region of a vertical transistor includes: forming a first liner layer on both sides of each active region of a substrate which has active regions spaced apart by a trench; forming a second liner layer over a portion of the surface of the first liner layer; filling a lower portion of the trench with a first sacrificial layer so that a portion of the first liner layer is exposed; forming a third liner layer over the exposed portion of the first liner layer and the second liner layer; filling the inside of the trench defined by the third liner layer with a second sacrificial layer; forming a polysilicon layer on a resulting structure in which the second sacrificial layer is formed; selectively doping impurities into the polysilicon layer by performing a plasma doping process and a tilt ion implantation process on the polysilicon layer; selectively exposing the third liner layer formed on one of the both sides of the active region, at which a one-side contact is to be formed, by selectively removing an undoped portion of the polysilicon layer; exposing the first liner layer formed on the side, at which the one-side contact is to be formed, by removing the exposed portion of the third liner layer; exposing a surface of a contact region, in which the one-side contact is to be formed, by removing the exposed portion of the first liner layer and the second sacrificial layer; removing the third liner layer and the first sacrificial layer; forming a doped conductive layer contacting the exposed surface of the contact region; and forming a one-side junction region by performing a thermal treatment to diffuse impurity ions within the conductive layer into the active region through the contact region.

The second sacrificial layer may be formed using a material having a sufficient low etching selectivity to the first liner layer so that the second sacrificial layer is removed when the exposed portion of the first liner layer is removed.

The third liner layer may be formed using a material having a sufficient etching selectivity to the second liner layer so that the second line layer is not removed when the third liner layer is removed.

The second liner layer and the first sacrificial layer may be formed using a material having a sufficient etching selectivity to the first liner layer so that the second liner layer and the first sacrificial layer are not removed when the exposed portion of the first liner layer is removed.

The first liner layer may include a silicon oxide layer, the second liner layer may include a silicon nitride layer, the third liner layer may include a titanium nitride layer, the first sacrificial layer may include a polysilicon layer, and the second sacrificial layer may include a spin-on-dielectric (SOD) oxide layer.

The doped conductive layer may have a polysilicon layer structure in which titanium/titanium nitride/impurity are doped.

The polysilicon layer may be formed to have a thickness ranging from about 30 Å to about 100 Å. Specifically, the polysilicon layer may be formed to have a thickness ranging from about 60 Å to about 80 Å.

The impurities may be selectively doped into the polysilicon layer by sequentially performing the plasma doping process and the tilt ion implantation process.

The plasma doping process on the polysilicon layer may be performed using an impurity source including at least one of boron, arsenic, and phosphorus.

The plasma doping process on the polysilicon layer may be performed on a condition that applies bias under the substrate so that impurity ions have straightness in a direction vertical to the surface of the substrate.

The plasma doping process on the polysilicon layer may be performed with energy ranging from about 0.1 KeV to about 3 KeV.

The plasma doping process on the polysilicon layer may be performed at a dose ranging from about $1E14$ ions/cm$^3$ to $3E15$ ions/cm$^3$.

The plasma doping process on the polysilicon layer may be performed on a condition that a width of a pulse for the plasma doping is at least 2 seconds or more.

The tilt ion implantation process on the polysilicon layer may be performed at an angle at which impurity ions are selectively doped into one of the both sides of the polysilicon layer.

The angle at which the tilt ion implantation process is performed on the polysilicon layer may be set to about 15 degrees to about 30 degrees.

The tilt ion implantation process on the polysilicon layer may be performed using an impurity source including at least one of boron, arsenic, and phosphorus.

The tilt ion implantation process on the polysilicon layer may be performed with energy ranging from about 2.5 KeV to about 5 KeV.

The tilt ion implantation process on the polysilicon layer may be performed at a dose ranging from about $1E15$ ions/cm$^3$ to $4E15$ ions/cm$^3$.

The undoped portion of the polysilicon layer may be selectively removed by a wet etching process using an etching solution which selectively removes only an undoped portion.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
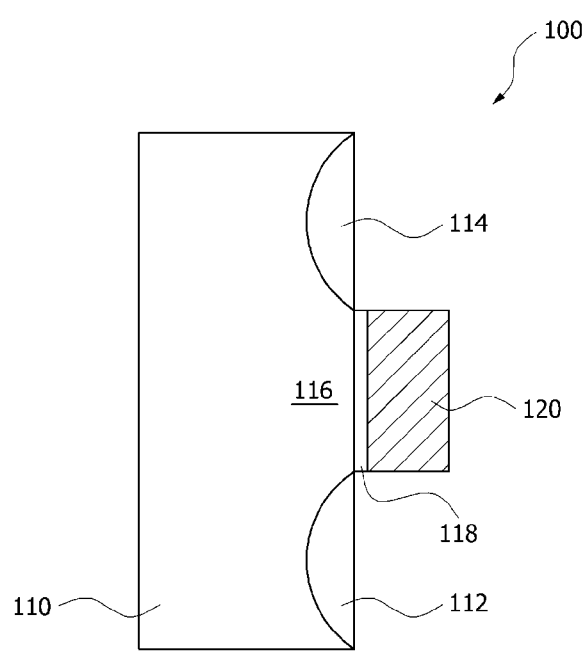
FIG. 1 is a view explaining the basic concept of a vertical transistor.
Figure 2:
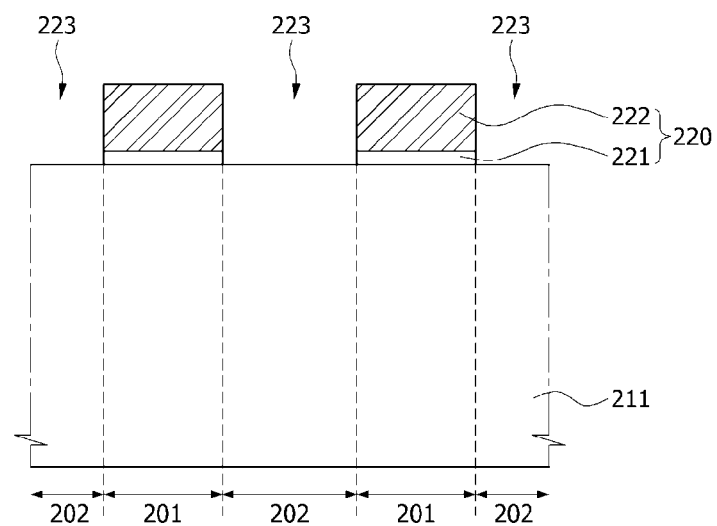
FIGS. 2 to 12 are cross-sectional views explaining a method for opening a one-side contact region according to an embodiment of the present invention.

FIGS. 2 to 12 are cross-sectional views explaining a method for opening a one-side contact region according to an embodiment of the present invention. Referring to FIG. 2, hard mask patterns 220 are formed on a semiconductor substrate 211, such as a silicon substrate. As an example, the hard mask pattern 220 has a structure in which a silicon oxide pattern 221 and a silicon nitride pattern 222 are sequentially stacked. The hard mask pattern 220 has an opening 223 exposing a portion of the surface of the semiconductor substrate 211. Portions covered by the hard mask patterns 220 are active regions 201 in which actives are to be formed, and portions exposed by the hard mask patterns 220 are trench regions 202 in which trenches are to be formed.

Figure 3:
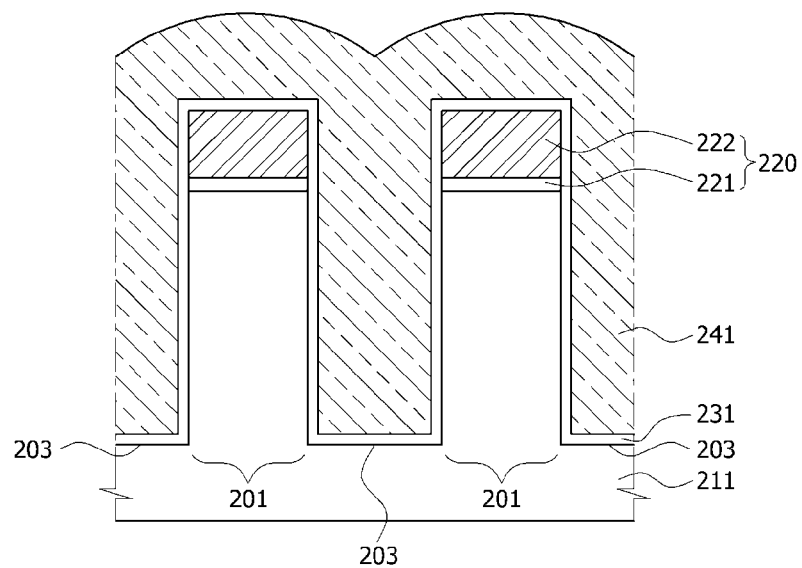

Referring to FIG. 3, trenches 203 are formed by etching the exposed portions of the semiconductor substrate 211 by a certain depth using the hard mask patterns 220 as an etching mask. A pillar-shaped active regions 201 are formed spaced apart from one another by the trenches 203. A first liner layer 231 is formed on the semiconductor substrate 211, in which the trenches 203 are formed, and the hard mask patterns 220. As an example, the first liner layer 231 is formed of silicon oxide. A first sacrificial layer 241 filling the trenches 203 is formed on a resulting structure. The first sacrificial layer 241 is formed of a material having a sufficient etching selectivity to the first liner layer 231. As an example, in a case in which the first liner layer 231 is formed of silicon oxide, the first sacrificial layer 241 may be formed of polysilicon.

Figure 4:
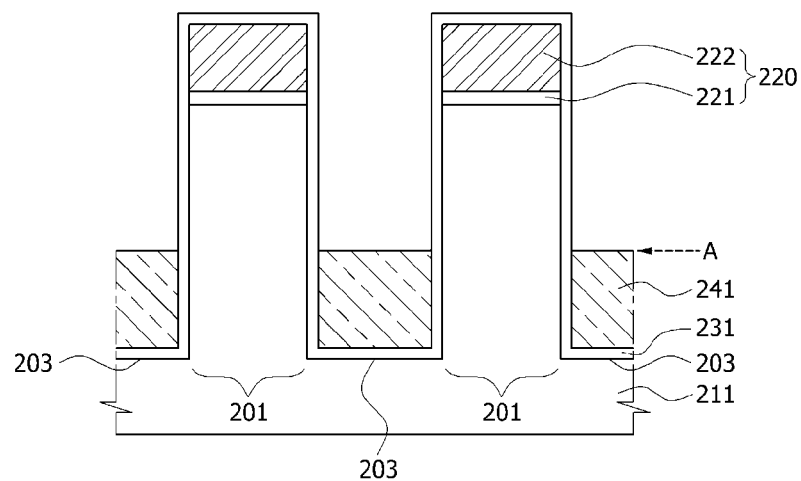

Referring to FIG. 4, the first sacrificial layer 241 is recessed by performing an anisotropic etching process on the first sacrificial layer 241. The anisotropic etching process may be performed using an etch-back process. The recessed first sacrificial layer 241 is remained at a lower portion of the trench 203. A position A of the top surface of the recessed first sacrificial layer 241 may be equal to an upper end of a one-side contact region. Therefore, the etching on the first sacrificial layer 241 should be performed to recess the first sacrificial layer 241 by an appropriate thickness, considering the position of the upper end of the one-side contact region.

Figure 5:
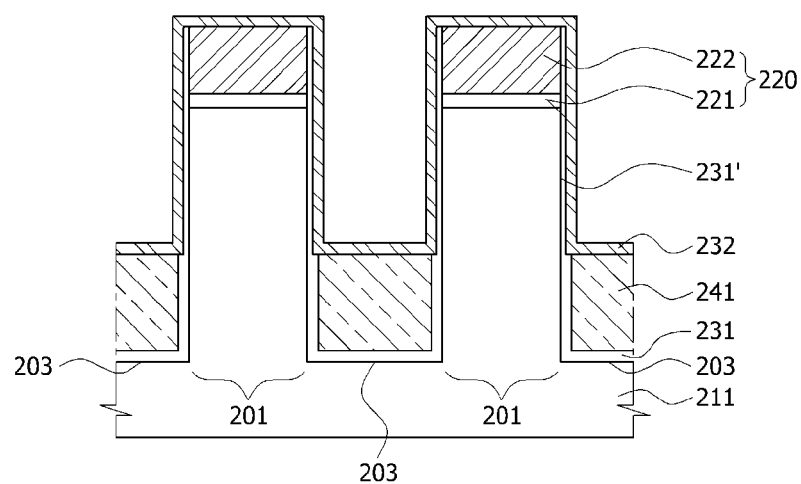

Referring to FIG. 5, a cleaning process is performed after the anisotropic etching on the first sacrificial layer 241. Due to the cleaning process, the first liner layer 231 on the top surface of the hard mask pattern 220 may be removed, and the thickness of the first liner layer (which is indicated by 231') on the sides of the active region 201 and the hard mask pattern 220 may be reduced by a certain amount. After the cleaning process, a second liner layer 232 is formed on a resulting structure. The second liner layer 232 is formed of a material having a sufficient etching selectivity to the first liner layer 231. As an example, in a case in which the first liner 231 is formed of silicon oxide, the second liner layer 232 may be formed of silicon nitride. The second liner layer 232 covers the top surface of the first sacrificial layer 241, the first liner layer 231, and the top surface of the hard mask pattern 220.

Figure 6:
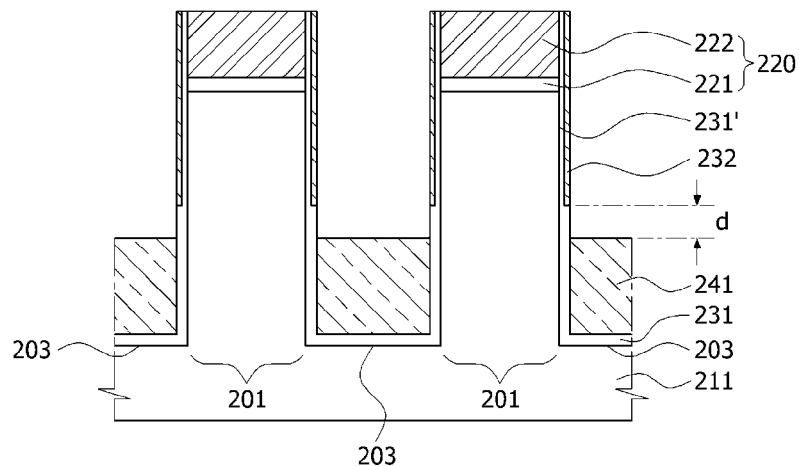

Referring to FIG. 6, the second liner layer 232 is formed in a spacer shape by performing an anisotropic etching process on the second liner layer 232. Due to this etching process, the second liner layer 232 on the top surface of the hard mask pattern 220 and the top surface of the first sacrificial layer 241 may be removed, and the spacer-shaped second liner layer 232 may remain on the first liner layer 231'. The etching on the second liner layer 232 is performed on a condition that the first sacrificial layer 241 is recessed by a certain thickness. As an example, in a case in which the second liner layer 232 is formed of silicon nitride and the first sacrificial layer 241 is formed of polysilicon, the polysilicon may also be removed by a certain thickness while the silicon nitride is removed, by an etching selectivity between the silicon nitride and the polysilicon. Here, the removed thickness d of the first sacrificial layer 241 becomes the height of the one-side contact region in which the one-side contact is to be formed. Therefore, the etching on the second liner layer 232 should be performed on a condition that can obtain a desired height of the contact region, considering the removed thickness d of the first sacrificial layer 241. In some cases, the process of recessing the first sacrificial layer 241 may be performed separately.

Figure 7:
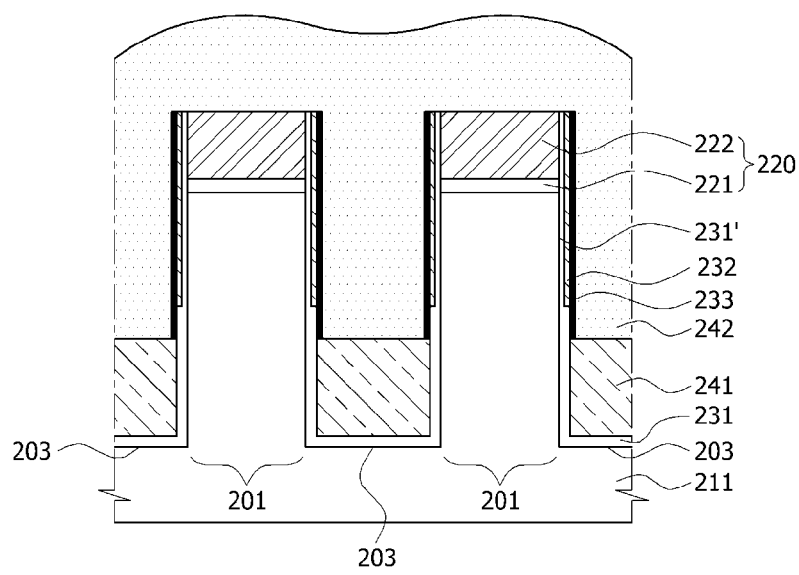

Referring to FIG. 7, after the spacer-shaped second liner layer 232 is formed and the first sacrificial layer 241 is recessed, a third liner layer 233 is formed on a resulting structure. The third liner layer 233 is formed on the top surface of the first sacrificial layer 241, the exposed surface of the first liner layer 231, the second liner layer 232, and the top surface of the hard mask pattern 220. The third liner layer 233 is formed of a material having a sufficient etching selectivity to the second liner layer 232. In addition, the third liner layer 233 is formed of a material having a sufficient etching selectivity to the first sacrificial layer 233. As an example, in a case in which the second liner layer 232 is formed of silicon nitride and the first sacrificial layer 241 is formed of polysilicon, the third liner layer 233 may be formed of titanium nitride (TiN). An anisotropic etching process is performed on the third liner layer 233 so that the third liner layer 233 is remained on the exposed surface of the first liner layer 231 and the second liner layer 232 in a spacer shape. The trench 203 is filled by forming a second sacrificial layer 242 on a resulting structure. The second sacrificial layer 242 is formed of a material which can be etched by the same etching solution as the first liner layer 231. As an example, in a case in which the first liner layer 231 is formed of silicon oxide, the second sacrificial layer 242 may also be formed of silicon oxide. In this case, a spin-on-dielectric (SOD) coating process may be used in order to sufficiently fill the trench 203.

Figure 8:
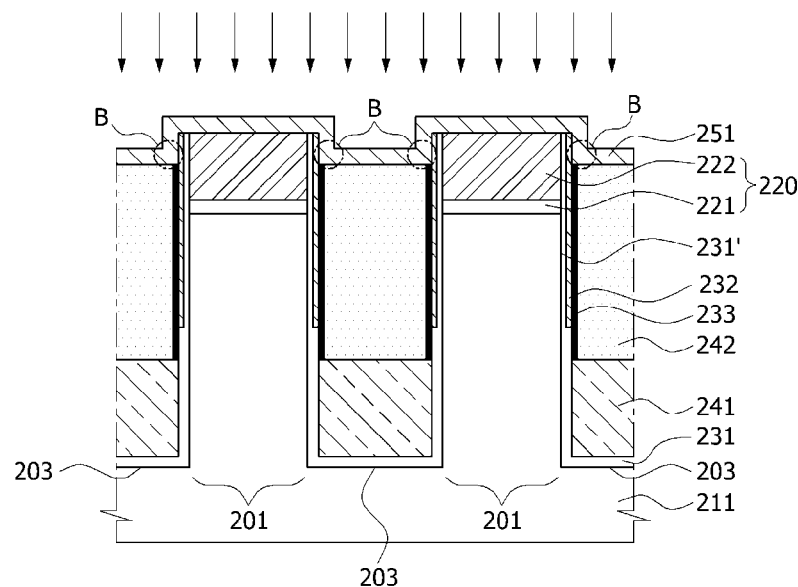

Referring to FIG. 8, the second sacrificial layer 242 on the hard mask layer 220 is removed by performing a planarization process on the second sacrificial layer 242. In this case, a removal rate is different due to a difference of a material between the hard mask layer 220 and the second sacrificial layer 242. As a result, the top surface of the second sacrificial layer 242 is formed under the top surface of the hard mask layer 220. A polysilicon layer 251 is formed as a mask layer on a resulting structure in which the second sacrificial layer 242 is planarized. The polysilicon layer 251 is a material which can be selectively removed by a selective impurity ion implantation process. The polysilicon layer 251 may be formed to have a thickness ranging from about 30 Å to about 100 Å. When the thickness of the polysilicon layer 251 is smaller than 30 Å, impurity ions doped in a subsequent process may penetrate into the underlying active region 201. When the impurity of the polysilicon layer 251 is larger than 100 Å, it may not be well removed during a selective removal through a subsequent impurity ion implantation process. Hence, the polysilicon layer 251 may be formed to have a thickness ranging from about 60 Å to about 80 Å. In order to selectively remove, for example, only a certain portion of the polysilicon layer 251 through a subsequent impurity ion implantation process, the polysilicon layer 251 may be formed in an undoped state in which no impurities are doped thereinto.

After the polysilicon layer 251 is formed, a plasma doping process is performed, as indicated by arrows. The plasma doping process may implant impurity ions at a very high dose with a relatively low energy, as compared to a conventional ion implantation process. The plasma doping process may be performed within a plasma doping chamber. The plasma doping chamber has a cathode supporting the substrate 211 at a lower portion of the chamber, and an anode forming plasma at an upper portion of the chamber. When strong bias is applied to the anode, plasma is formed at the upper portion of the chamber, and impurity ions within the plasma are accelerated toward the substrate 211 by bias applied to the cathode and are doped into the polysilicon layer 251. At this time, the impurity ions have straightness in a direction vertical to the surface of the substrate 211 by the bias applied to the cathode. Therefore, the impurity ions are doped into the portion which is exposed toward the top surface among all regions of the polysilicon layer 251. As indicated by arrows B, impurity ions may not be doped into the portion which is not exposed toward the top surface.

The plasma doping process is performed using an impurity source including at least one of boron (B), arsenic (As), and phosphorus (P). As an example, $BF_3$ or $B_2H_6$ may be used as the impurity source including boron (B). When the plasma doping process is performed, the energy is set to about 0.1 KeV to about 3 KeV. When the energy is set to below 0.1 KeV, the impurity ion implantation efficiency may become lowered. On the other hand, when the energy is set to above 3 KeV, the impurity ions may be doped into the active region 201, and thus it may cause an unexpected change in the threshold voltage of the device. The dose is set to about 1E14 ions/cm³ to 3E15 ions/cm³. In addition, since the bias is applied in pulse units, the plasma doping process may also be performed in pulse units. Therefore, when the dose is maximally set to 3E15 ions/cm³, the width of the pulse for the plasma doping process is set to at least 2 seconds or more, so that a sufficient amount of doses are doped.

Figure 14:
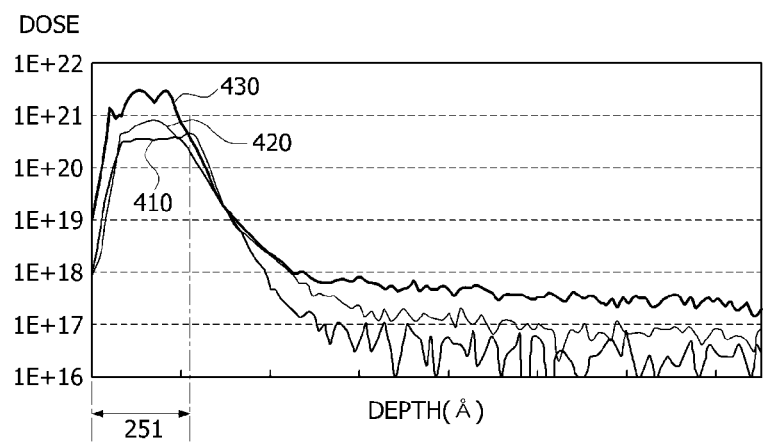
FIG. 14 is a graph showing a comparison of impurity ion distribution between a case in which a plasma doping process is adopted and a case in which a plasma doping process is not adopted.

FIG. 14 is a graph showing a comparison of impurity ion distribution between a case in which the plasma doping process is adopted and a case in which the plasma doping process is not adopted. In FIG. 14, a line indicated by reference numeral "410" represents a case in which boron (B) is doped by a conventional 0-degree ion implantation process, and lines indicated by reference numerals "420" and "430" represent cases in which boron (B) is doped by the plasma doping process. Specifically, the line indicated by reference numeral "420" represents a case in which the energy is set to 1 KeV, and the width of the pulse for the plasma doping process is set to 3 seconds, and the line indicated by reference numeral "430" represents a case in which the energy is set to 3 KeV, and the width of the pulse for the plasma doping process is set to 2 seconds. In any case, when the plasma doping process is performed, the doping concentration in the polysilicon layer 251 is higher than the case of the conventional ion implantation process. This means that the plasma doping process can obtain a higher implantation dose in a shorter time, as compared to the case in which ions are doped by the conventional 0-degree ion implantation process. As a result, it means that a dose difference between the doped portion and the undoped portion of the polysilicon layer 251 may increase in a short time.

Figure 9:
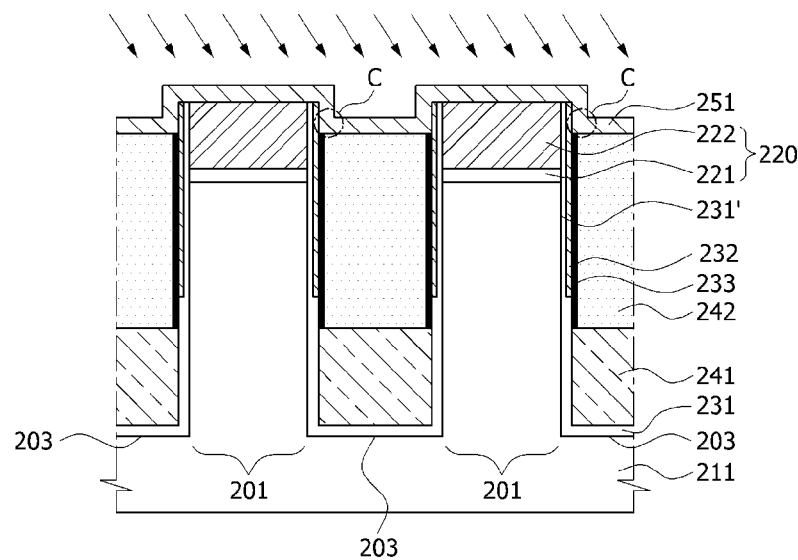

Referring to FIG. 9, after the plasma doping process, a tilt ion implantation process is performed as indicated by arrows. The tilt ion implantation process is performed by implanting impurity ions at a inclined angle with reference to a line vertical to the surface of the polysilicon layer 251 into which the impurity ions are doped. That is, the tilt ion implantation process on the polysilicon layer 251 is performed at an angle at which impurities are selectively doped into one of both sides (B in FIG. 8) of the polysilicon layer 251, and impurities are not doped into the other side (C in FIG. 9). The tilt angle may be changed according to the integration density of the device. As an example, in the case of a 40-nm-pitch device, the tilt angle is set to about 15 degrees to about 30 degrees. At least one of boron (B), arsenic (As), and phosphorous (P) may be used as an impurity source. As an example, $BF_2$ including boron (B) may be used as the impurity source. The energy is set to about 2.5 KeV to about 5 KeV, and the dose is set to about 1E15 ions/cm³ to 4E15 ions/cm³. As in the case of the plasma doping process, when the energy is set to below 2.5 KeV, the impurity ion implantation efficiency may become lowered. On the other hand, when the energy is set to above 5 KeV, the impurity ions may be doped into the active region 201, and thus it may cause an unexpected change in the threshold voltage of the device. As such, when the plasma doping process and the tilt ion implantation process are sequentially performed, the portions other than the portion indicated by reference symbol "C" in the polysilicon layer 251 may become a doped state in which impurity ions are doped thereinto.

Figure 10:
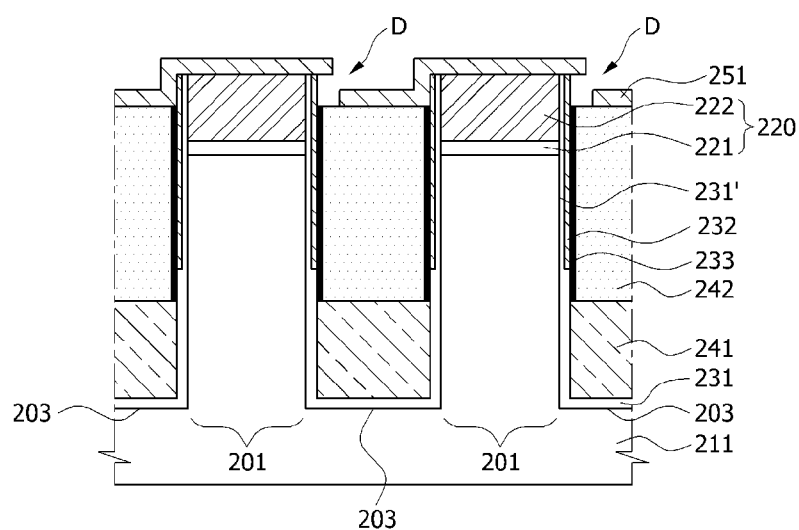

Referring to FIG. 10, a selective etching process is performed on the partially doped polysilicon layer 251. The selective etching process is performed by a wet etching process using an etching solution which selectively removes, for example, only the undoped portion (C in FIG. 9) of the polysilicon layer 251. After the selective etching process, as indicated by reference symbol "D", an opening is formed at an upper portion of one of both sides of the active region 201, in which a one-side contact is to be formed, and the top surface of the third liner layer 233 is exposed through the opening.

Figure 15:
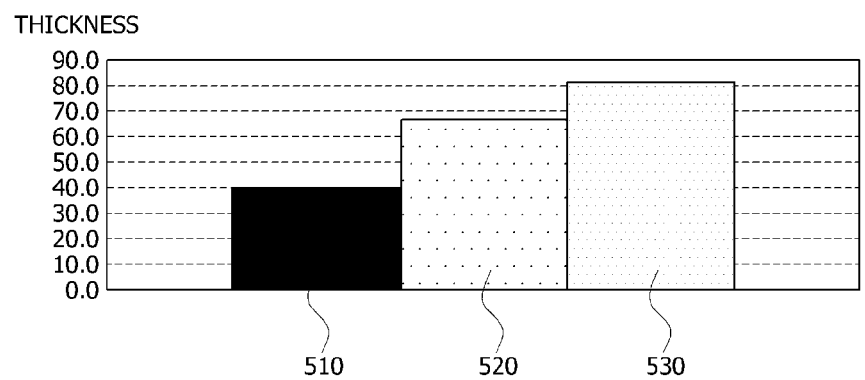
FIG. 15 is a graph showing a comparison of a thickness of an unetched portion of a polysilicon layer between a case in which a plasma doping process is adopted and a case in which a plasma doping process is not adopted.

FIG. 15 is a graph showing the comparison of the thickness of the unetched portion of the polysilicon layer between a case in which the plasma doping process is adopted and a case in which the plasma doping process is not adopted. In FIG. 15, a bar indicated by reference numeral "510" represents a case in which boron (B) is doped by a conventional 0-degree ion implantation process, and bars indicated by reference numerals "520" and "530" represent cases in which boron (B) is doped by the plasma doping process. Specifically, the bar indicated by reference numeral "520" represents a case in which the energy is set to 1 KeV, and the width of the pulse for the plasma doping process is set to 3 seconds, and the bar indicated by reference numeral "530" represents a case in which the energy is set to 3 KeV, and the width of the pulse for the plasma doping process is set to 2 seconds. In any case, it can be seen that the thickness of the polysilicon layer 251 remaining after the selective etching process is performed on the polysilicon layer 251 is larger in the cases 520 and 530 of the plasma doping process than in the case 510 of the conventional ion implantation process. This means that the plasma doping process can obtain a higher implantation dose in a shorter time, as compared to the case in which ions are doped by the conventional 0-degree ion implantation process, and the etching selectivity between the doped portion and the undoped portion of the polysilicon layer 251 is high.

Figure 11:
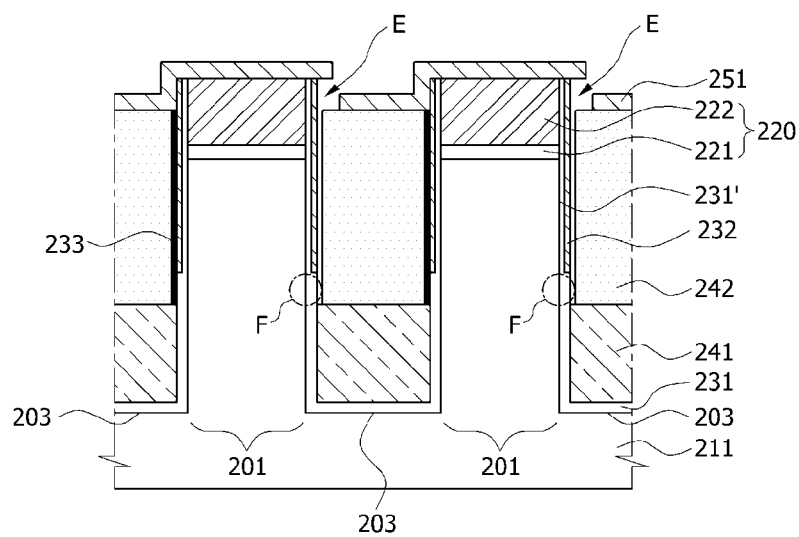

Referring to FIG. 11, an etching process for removing the third liner layer 233 is performed. The removal of the third liner layer 233 is performed using a dip-out wet etching process. That is, the third liner layer 233 is dipped into a container containing a wet etching solution. This etching process removes, for example, only the third liner layer 233 exposed by the opening E among the third liner layers 233 existing on both sides of the active region 201, that is, the side at which the one-side contact is to be formed. As a result, the opening E is formed in the region in which the third liner layer 233 has existed in the side at which the one-side contact is to be formed. As indicated by "F", the opening E exposes the first liner layer 231' at the side at which the one-side contact is to be formed. In addition, a portion of the surface of the second sacrificial layer 242 is also exposed by the opening E. After the first liner layer 231 is exposed to the side at which the one-side contact is to be formed, the remaining polysilicon layer 251 is removed.

Figure 12:
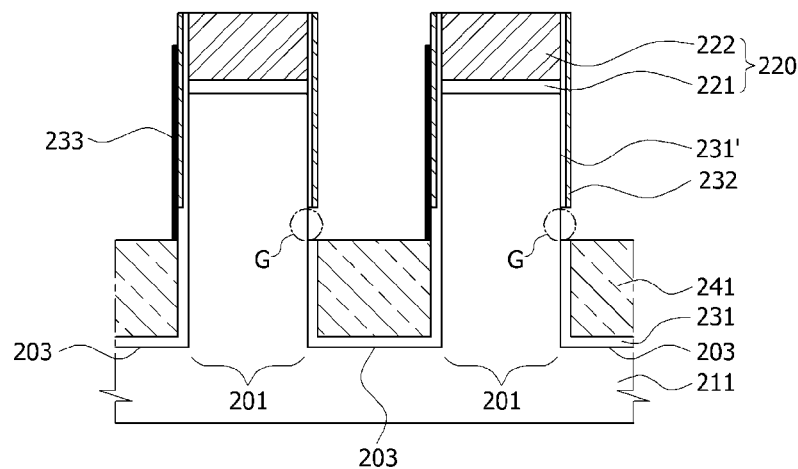

Referring to FIG. 12, the first liner layer 231' and the second sacrificial layer 242 exposed to the side at which the one-side contact is to be formed are removed. As described above with reference to FIG. 7, since the second sacrificial layer 242 is formed of a material which can be etched by the same etching solution as the first liner layer 231', the exposed portion of the first liner layer 231' is also removed by the single etching process. Due to such an etching process, the surface of a contact region (G in FIG. 12) in which the one-side contact of the active region 201 is to be formed is opened within the trench.

Figure 13:
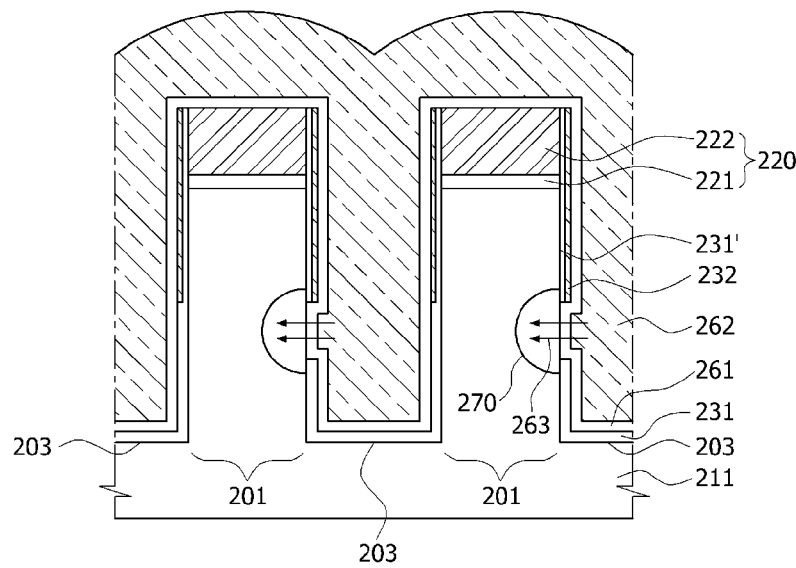
FIG. 13 is a cross-sectional view explaining a method for fabricating a one-side junction region of a vertical transistor according to an embodiment of the present invention.

FIG. 13 is a cross-sectional view explaining a method for fabricating a one-side junction region of a vertical transistor according to an embodiment of the present invention. As described above with reference to FIGS. 2 to 12, the contact region (G in FIG. 12) for the formation of the one-side contact is opened. As illustrated in FIG. 13, the third liner layer 233 is removed, and conductive layers 261 and 262 are formed on a resulting structure. The conductive layers 261 and 262 are formed for diffusing the impurity ions into the active region in which the one-side junction region is to be formed. To this end, the conductive layers 261 and 262 are formed in a state in which impurity ions are doped thereinto. As an example, the conductive layers 261 and 262 include a titanium/titanium nitride (Ti/TiN) layer 261 and a doped polysilicon layer 262. After the conductive layers 261 and 262 are formed, a thermal treatment is performed. Thus, as indicated by arrows 263, a one-side junction region 270 is formed by diffusing the impurity ions within the conductive layers 261 and 262 into the active region 201 through the one-side contact region. Although not illustrated, after the one-side junction region 270 is formed, an interconnection layer connected to the one-side junction region 270 may be formed after the removal of the conductive layers 261 and 262.

According to the exemplary embodiments of the present invention, instead of the vertical ion implantation process using the conventional ion implantation process, the plasma doping process is used. Thus, a large amount of impurity ions are doped into the polysilicon layer in a short time with relatively low energy that does not penetrate the polysilicon layer. Therefore, the time necessary for the impurity ion implantation in the vertical direction may be shortened. Since a large amount of impurity ions are doped in a short time by the plasma doping process, an amount of impurity ions to be doped during the tilt ion implantation process is reduced. Thus, the time necessary for the tilt ion implantation is also shortened. Furthermore, since a sufficient amount of impurity ions are selectively doped into one side of the polysilicon layer, it is possible to obtain superior selectivity between the doped portion and the undoped portion during the selective removal of the polysilicon layer.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A method for opening a one-side contact region of a vertical transistor, the method comprising:
    forming a first liner layer on both side walls of each pillar-shaped active region of a substrate which is spaced apart by a trench;
    forming a second liner layer over a portion of the surface of the first liner layer;
    forming a first sacrificial layer at a lower portion of the trench so that a portion of the first liner layer is exposed;
    forming a third liner layer over the exposed portion of the first liner layer and the second liner layer;
    filling the inside of the trench over the third liner layer and the first sacrificial layer with a second sacrificial layer;
    forming a polysilicon layer on a resulting structure in which the second sacrificial layer is formed;
    selectively doping impurities into the polysilicon layer by performing a plasma doping process and a tilt ion implantation process on the polysilicon layer;
    selectively exposing the third liner layer formed on one of the both sides of the active region, at which a one-side contact is to be formed, by selectively removing an undoped portion of the polysilicon layer;
    exposing the first liner layer formed on the side, at which the one-side contact is to be formed, by removing the exposed portion of the third liner layer; and
    exposing a surface of a contact region, in which the one-side contact is to be formed, by removing the exposed portion of the first liner layer.

2. The method of claim 1, wherein the polysilicon layer is formed to have a thickness ranging from about 30 Å to about 100 Å.

3. The method of claim 2, wherein the polysilicon layer is formed to have a thickness ranging from about 60 Å to about 80 Å.

4. The method of claim 1, wherein the impurities are selectively doped into the polysilicon layer by sequentially performing the plasma doping process and the tilt ion implantation process.

5. The method of claim 1, wherein the plasma doping process on the polysilicon layer is performed using an impurity source including at least one of boron, arsenic, and phosphorus.

6. The method of claim 1, wherein the plasma doping process on the polysilicon layer is performed on a condition that a bias is applied under the substrate so that impurity ions have straightness in a direction vertical to the surface of the substrate.

7. The method of claim 1, wherein the plasma doping process on the polysilicon layer is performed with energy ranging from about 0.1 KeV to about 3 KeV.

8. The method of claim 1, wherein the plasma doping process on the polysilicon layer is performed at a dose ranging from about 1E14 ions/cm$^3$ to 3E15 ions/cm$^3$.

9. The method of claim 1, wherein the plasma doping process on the polysilicon layer is performed on a condition that a width of a pulse for the plasma doping is at least 2 seconds or more.

10. The method of claim 1, wherein the tilt ion implantation process on the polysilicon layer is performed at an angle at which impurity ions are selectively doped into one of the both sides of the polysilicon layer.

11. The method of claim 10, wherein the angle at which the tilt ion implantation process is performed on the polysilicon layer is set to about 15 degrees to about 30 degrees.

12. The method of claim 1, wherein the tilt ion implantation process on the polysilicon layer is performed using an impurity source including at least one of boron, arsenic, and phosphorus.

13. The method of claim 1, wherein the tilt ion implantation process on the polysilicon layer is performed with energy ranging from about 2.5 KeV to about 5 KeV.

14. The method of claim 1, wherein the tilt ion implantation process on the polysilicon layer is performed at a dose ranging from about 1E15 ions/cm$^3$ to 4E15 ions/cm$^3$.

15. The method of claim 1, wherein the undoped portion of the polysilicon layer is selectively removed by a wet etching process using an etching solution which selectively removes only an undoped portion.

16. The method of claim 1, wherein the third liner layer is formed using a material having a sufficient etching selectivity to the second liner layer so that the second line layer is not removed when the third liner layer is removed.

17. The method of claim 1, wherein the second liner layer and the first sacrificial layer are formed using a material having a sufficient etching selectivity to the first liner layer so that the second liner layer and the first sacrificial layer are not removed when the exposed portion of the first liner layer is removed.

18. The method of claim 1, wherein,
the first liner layer comprises a silicon oxide layer,
the second liner layer comprises a silicon nitride layer,
the third liner layer comprises a titanium nitride layer, and
the first sacrificial layer comprises a polysilicon layer.

19. A method for fabricating a one-side junction region of a vertical transistor, the method comprising:

forming a first liner layer on both side walls of each pillar-shaped active region of a substrate which is spaced apart by a trench;

forming a second liner layer over a portion of the surface of the first liner layer;

forming a first sacrificial layer at a lower portion of the trench so that a portion of the first liner layer is exposed;

forming a third liner layer over the exposed portion of the first liner layer and the second liner layer;

filling the inside of the trench over the third liner layer and the first sacrificial layer with a second sacrificial layer;

forming a polysilicon layer on a resulting structure in which the second sacrificial layer is formed;

selectively doping impurities into the polysilicon layer by performing a plasma doping process and a tilt ion implantation process on the polysilicon layer;

selectively exposing the third liner layer formed on one of the both sides of the active region, at which a one-side contact is to be formed, by selectively removing an undoped portion of the polysilicon layer;

exposing the first liner layer formed on the side, at which the one-side contact is to be formed, by removing the exposed portion of the third liner layer;

exposing a surface of a contact region, in which the one-side contact is to be formed, by removing the exposed portion of the first liner layer and the second sacrificial layer;

removing the third liner layer and the first sacrificial layer;

forming a doped conductive layer contacting the exposed surface of the contact region; and forming a one-side junction region by performing a thermal treatment to diffuse impurity ions within the conductive layer into the active region through the contact region.

20. The method of claim 19, wherein the second sacrificial layer is formed using a material having a sufficient low etching selectivity to the first liner layer so that the second sacrificial layer is removed when the exposed portion of the first liner layer is removed.

21. The method of claim 19, wherein the doped conductive layer has a polysilicon layer structure in which titanium/titanium nitride/impurity are doped.

* * * * *